(12) United States Patent
Duan et al.

(10) Patent No.: US 8,537,689 B2
(45) Date of Patent: Sep. 17, 2013

(54) METHOD FOR MINIMIZING UNDETECTABLE ERRORS IN DATA PACKETS IN COMMUNICATION SYSTEMS

(75) Inventors: Chunjie Duan, Brookline, MA (US); Yige Wang, Natick, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 430 days.

(21) Appl. No.: 13/026,336

(22) Filed: Feb. 14, 2011

(65) Prior Publication Data

US 2012/0207027 A1     Aug. 16, 2012

(51) Int. Cl.
*H04J 1/16*    (2006.01)

(52) U.S. Cl.
USPC .......................................... 370/241

(58) Field of Classification Search
USPC .................. 714/715, 716, 709, 739
See application file for complete search history.

(56) References Cited

U.S. PATENT DOCUMENTS

| | | | |
|---|---|---|---|
| 6,625,764 B1 * | 9/2003 | Dawson | 714/715 |
| 7,653,844 B2 * | 1/2010 | Sasaki | 714/716 |

* cited by examiner

*Primary Examiner* — Chi Pham
*Assistant Examiner* — Alexander O Boakye
(74) *Attorney, Agent, or Firm* — Dirk Brinkman; Gene Vinokur

(57) ABSTRACT

Undetectable errors in packets are minimized by verifying the CRC in each packet, setting a CRC flag to 0 to indicate success, and setting the CRC flag to 1 to indicate failure. If at least one packet in the set of packets fails then generate an error pattern E for each packet by comparing the packet that fails with one packet that passed the CRC verification, and comparing the error pattern to a set of known error patterns. Then, setting a CRC flag to 0 to indicate success and passing the payload of each packet and the CRC flag to the application if the difference is less than a predetermined threshold, and otherwise, setting the CRC flag to 1 to indicate failure.

7 Claims, 4 Drawing Sheets

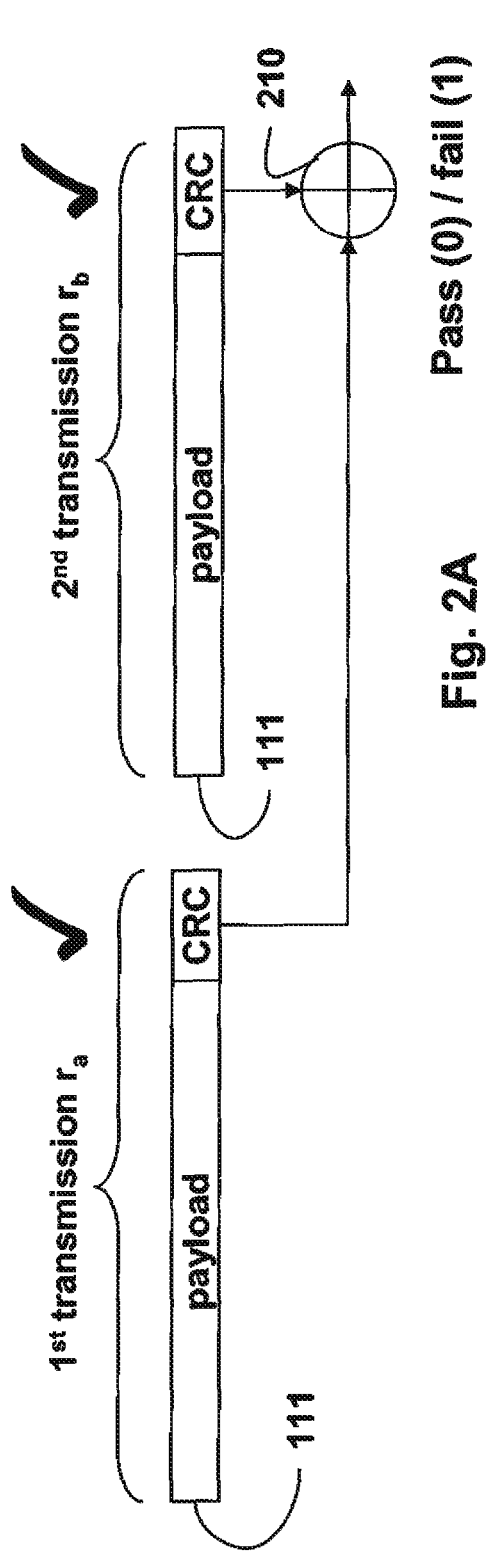
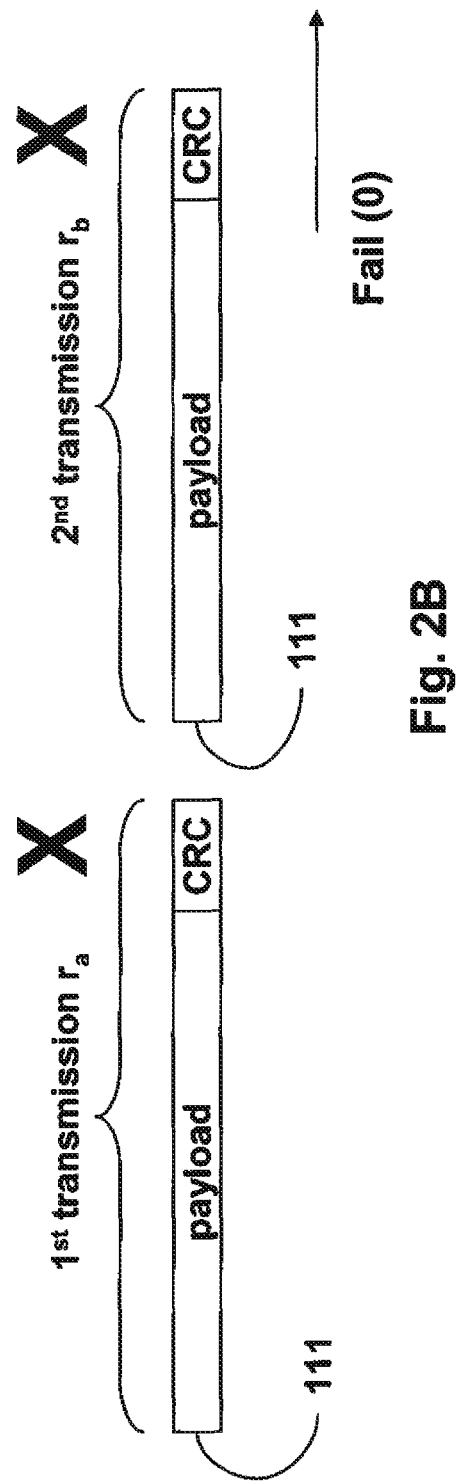
Fig. 2A
Fig. 2B

METHOD FOR MINIMIZING UNDETECTABLE ERRORS IN DATA PACKETS IN COMMUNICATION SYSTEMS

FIELD OF THE INVENTION

This invention relates generally to digital communications, and more particularly to reliable communications in safety application, such as in transportation systems by minimizing undetectable errors in data packets.

BACKGROUND OF THE INVENTION

Communication systems in safety applications require high reliability. Error detection codes are often used to ensure that a probability $P_{ue}$ of an undetectable error is low. A cyclic redundancy check (CRC) is one common error detection code. Herein, the term CRC is used both for the code and functions that generate and verify the code.

FIG. 1 shows a conventional communication system 101 for a safety application 105. The safety application can be embedded in a transportation system, such as an elevator system, an aircraft, or any other system that requires high reliability.

A payload 110 is generated by the application 105. A transmitter 102 generates and appends the CRC to the payload in a packet. The packet 111 is encoded to an encoded packet 112. The encoded packet 112 is modulated into a modulated packet 113, which is transmitted through a noisy channel 104.

A receiver 103 receives the modulated received packet 123 and demodulated the received packet into a demodulated packet 122. The demodulated packet is decoded by an error correction decoder into a decoded packet 121. The decoded packet passes through the CRC verification. If the CRC is successful, a CRC flag 128 is set to 0, and the payload and the CRC flag is passed to the application 105. If an error is detected, the CRC flag is set to 1, and appropriate action is taken by the receiver, such as a request for retransmission. In this case, the application does not receive the erroneous payload.

The CRC cannot guarantee that the probability $P_{ue}$ is 0. For linear error detection code, an undetectable error can occurs when an error pattern in the payload is a valid codeword.

Although rare, an undetectable error is extremely harmful in safety applications, and can cause unsafe operation and catastrophic events. Therefore, it is extremely important to design the communication system, such that the probability $P_{ue}$ of undetectable errors is minimized.

Communication systems that provide high reliability and a low packet loss rate typically use redundant transmissions in time, frequency, spatial and/or code domains.

Conventionally, the receiver considers a packet delivery successful if at least one of the transmissions passes the CRC. A packet delivery fails ONLY if all the transmissions and retransmissions are unsuccessful.

Such mechanism may not meet the requirements needed for safety applications because of a high probability $P_{ue}$.

Therefore, it is desired to minimize the probability $P_{ue}$ of undetectable errors in communication systems in safety applications.

SUMMARY OF THE INVENTION

Embodiments of the invention provide a method for combining information received from a set of packets to minimize a probability $P_{ue}$ of undetectable errors in received packets in a communication system used with a safety applications. It is understood that embodiments can also be implemented in other systems that require a high reliability.

If the set of received packets pass the CRC, then the receiver compares the CRCs of all the packets to ensure the CRCs match.

If some packets succeeded and at least one packet failed, then the receiver generates error patterns of the failed packets from the successful packets, and compares the patterns of the failed with a set of known error patterns to determine a probability of the undetectable error. If the probability of the undetectable error is greater than the probability of a correct reception, the payload is not passed to the application, and a CRC flag is set 1 to indicate a failed reception for the application. Otherwise, if the CRC is verified, then the CRC flag is set to 0 and the payload and the CRC flag is passed to the application.

BRIEF DESCRIPTION OF THE DRAWINGS

FIG. 2A is a schematic of a reception when both transmissions are successful according to embodiments of the invention;

FIG. 2B is a schematic of a failed reception when both transmissions fail according to embodiments of the invention;

DETAILED DESCRIPTION OF THE PREFERRED EMBODIMENT

For simplicity of this description we use a set of two packets with a corresponding $1^{st}$ transmission and a corresponding $2^{nd}$ transmission for transmitting the set of packets to a receiver in a communication system in a safety application. At the receiver, the set of decoded packets includes packet $r_a$ and packet $r_b$. It is understood that additional transmissions of the packet can be used, i.e., the set can include more than two packets. Each packet includes a payload and a cyclical redundancy check (CRC). It is also understood that in some applications, bits in a packet can change between transmissions, e.g., a retransmission flag is set, or a sequence number is incremented.

As shown in FIG. 2A, the CRC in both decoded packets $r_a$ and $r_b$ can be verified (✓). The receiver compares 210 the CRC of two packets. If identical, then the receiver sets a flag to 0, and passes the payload and the CRC flag to the application. If different, the receiver sets the flag to 1, and the packet delivery fails, and only the CRC flag is passed to the application.

In the case of three or more transmissions and retransmissions of the packet, correction can be done according to a majority rule.

As shown in FIG. 2B, if both decoded packets fail (X) the CRC verification, the receiver sets the CRC flag to 1 and the packet delivery fails, and only the CRC flag is passed to the application.

Figure 1:
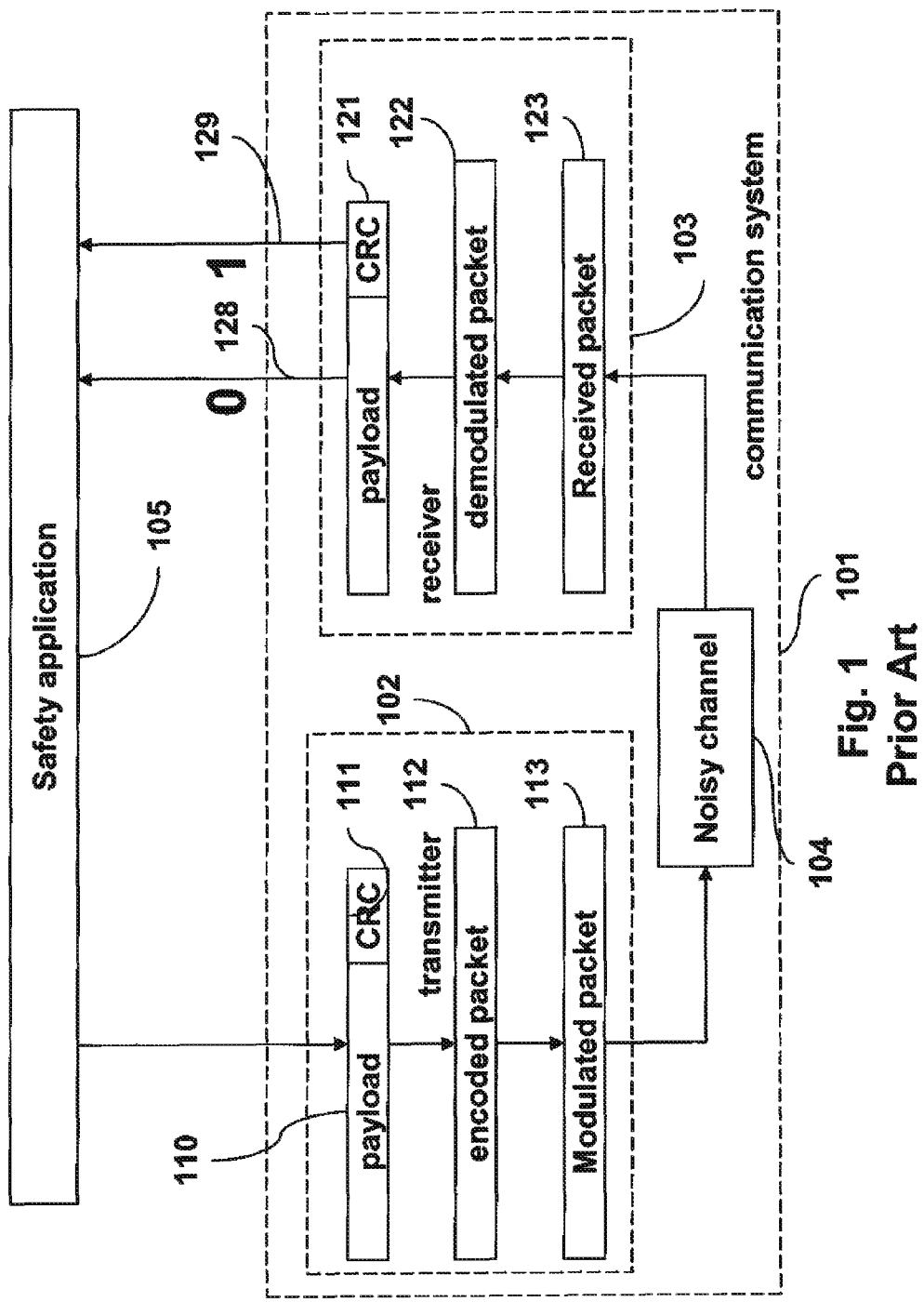
FIG. 1 is a schematic of a communication system in a safety application according to embodiments of the invention.
Figure 3:
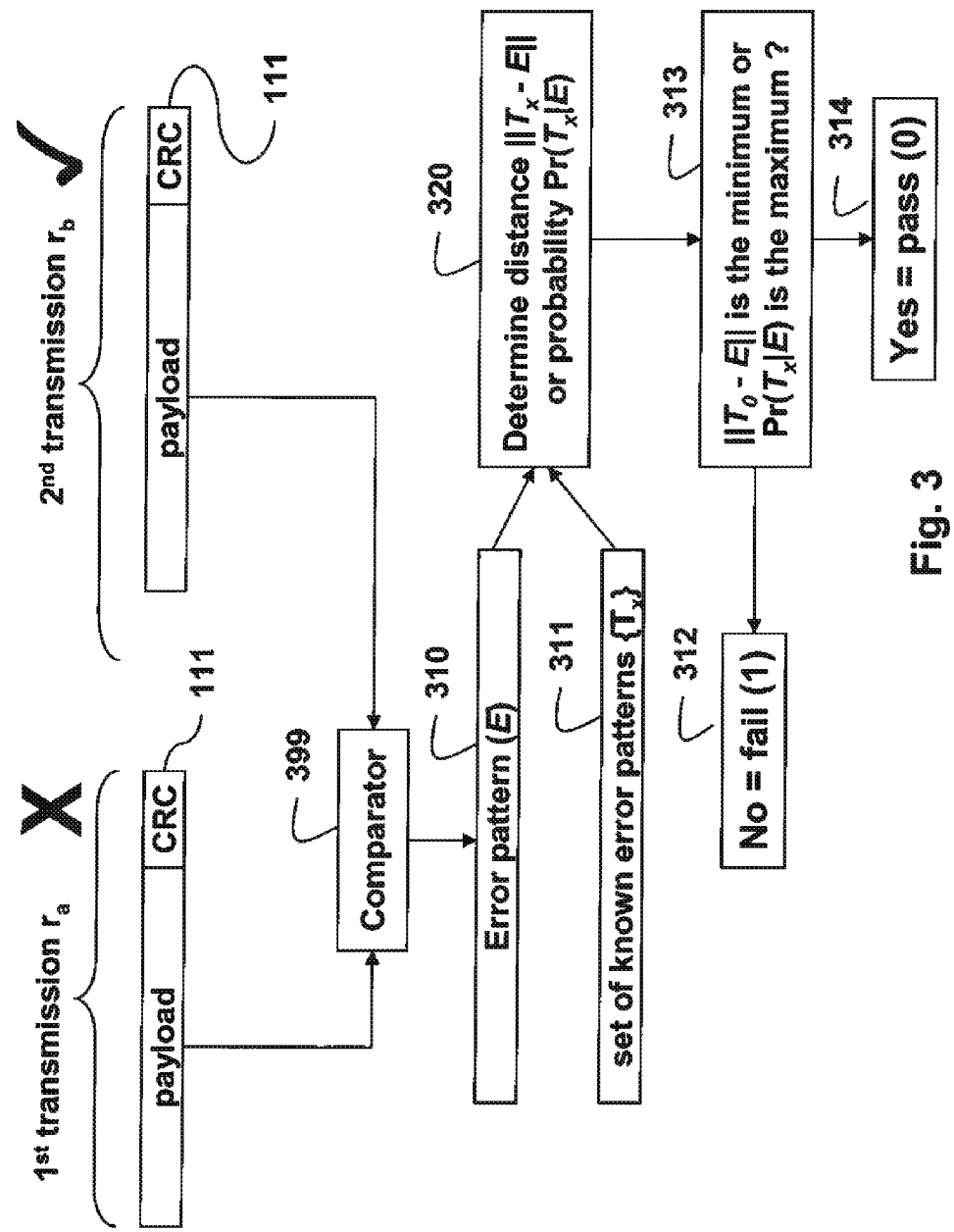
FIG. 3 is a schematic of a reception when one transmission is successful and one transmission fails according to embodiments of the invention.

As shown in FIG. 3, one transmission fails (X) the CRC verification and the other transmission passes the CRC. That is, the CRC cannot be verified in at least one packet in the set.

The receiver first generates an error pattern E for each packet that fails the CRC verification by comparing 399 the packet that fails the CRC verification with the packet that passed the CRC verification. In the case that the decoded messages are binary sequences, this can be carried out by exclusive ORing (XOR) of the bits in the two packets.

The error pattern E is compared to a set of known error patterns $\{T_x\}$, where the subscript index is in the range [0, K]. $T_0$ is an all zero pattern, and the other K patterns include all valid codewords with weights less than a predetermined value j.

The comparing essentially determines a difference between error pattern and the known error patterns. The difference can be expressed as a distance or a probability. If the distance is less than a predetermined threshold set by the application, the verification succeeds, and otherwise the verification fails.

Distance Based Difference

In one embodiment, distances $D_x$ between the error pattern E 310 and known error patterns $T_x$ 311 are determined 320 for all $x \in [0, K]$, where $D_x = \|E - T_x\|$. A large number of distance measurements are known in the art, such as the Hamming or Levenshtein distance.

If a distance $D_0$ is the minimum distance, the receiver indicates success, and, sets the CRC flag to 0, and passes the payload and the CRC flag to the application. If $D_0$ is larger than the minimum distance, then the receiver declares failure, and sets the CRC flag to 1, and only passes the CRC flag to the application.

Probability Based Difference

In the cases that the decoder is capable of generating soft outputs, the decoded sequences $r_a$ and $r_b$ can be a real sequence instead of binary sequence. A soft error pattern E 310 can be computed by the comparator 399. A conditional probability $Pr(T_x|E)$ can then be determined. If the conditional probability $Pr(T_0|E)$ is a maximum probability, then the receiver declares a success, sets the flag to 0, and passes the payload and the CRC flag to the application. If $Pr(T_0|E)$ is less than the maximum probability, then the receiver declares failure and sets the CRC flag to 1, and only passes the CRC flag to the application.

As an example, if soft error pattern E can be modeled as Gaussian distribution, then $Pr(T_x|E)$ can be written as $$Pr(T_x \mid E) = \prod_n \exp\left(\frac{-(E(n) - T_x(n))^2}{2\sigma^2}\right),$$

where $E(n)$ is the $n^{th}$ element of E, $T_x(n)$ is the $n^{th}$ element of $T_x$, and $\sigma^2$ is the variance of E.

Figure 4:
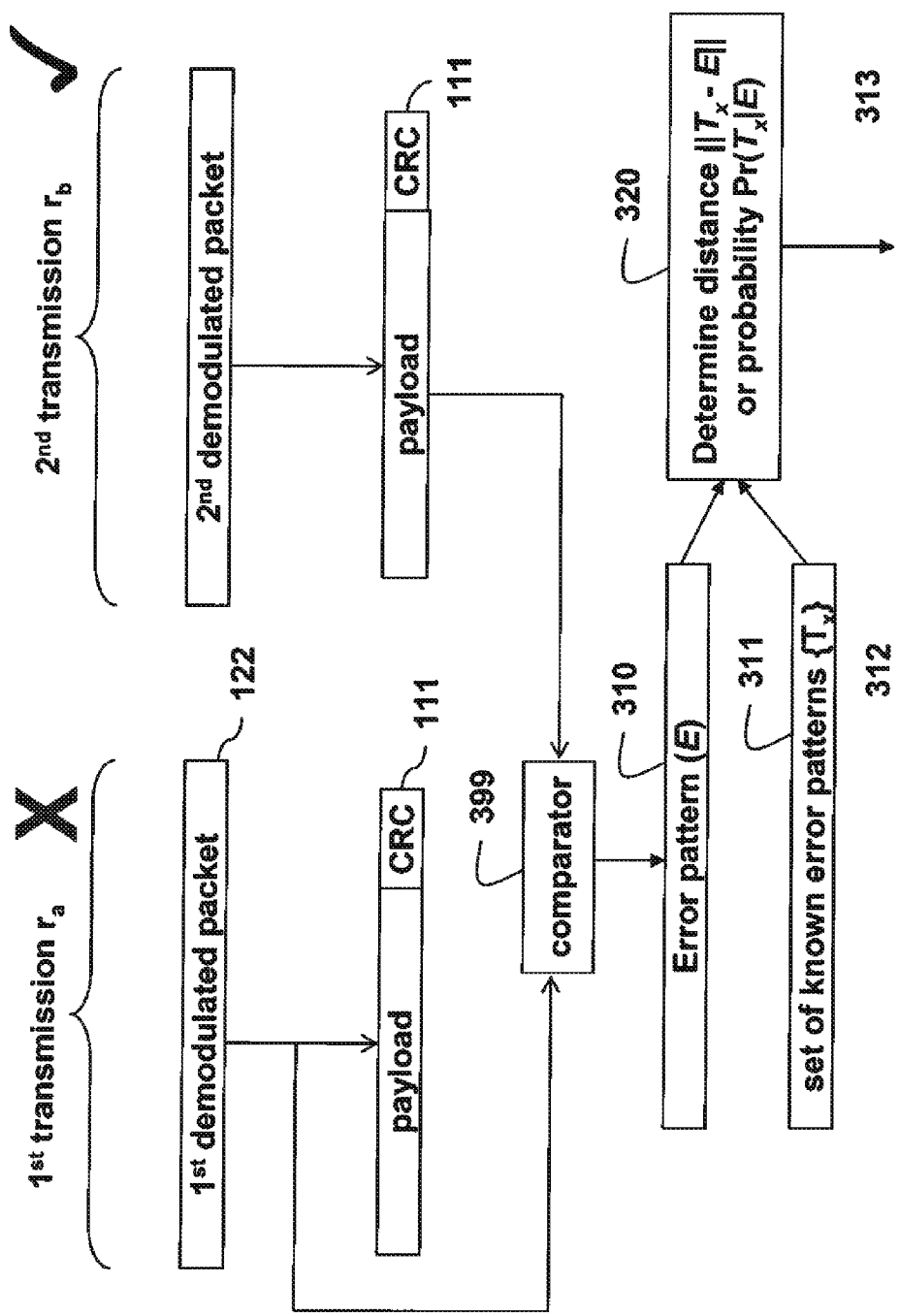
FIG. 4 is a schematic of a reception when one transmission is successful and one transmission fails according to another embodiment of the invention.

FIG. 4 shows another embodiment of the invention, if systematic codes are used for channel coding, the demodulated packet 122 can be used directly as input to the comparator 399 for the packet that fails the CRC verification. For the packet that passes CRC check, the decoded payload is the other input to the comparator 399. Similarly, the soft error pattern E can be produced by the comparator.

In some applications, certain bits (fields) in the payloads of the packets are known to change between transmissions, e.g., a retransmission flag is set, or a sequence number is incremented. In such cases, it is not possible to compare two decoded packets directly. But because the number of modified bits in the payload is typically very small and the bits are also deterministic and known, the receiver can take the decoded packet, modify the known bits accordingly, and regenerate the CRC to produce a modified packet. The receiver then compares the modified packet and the failed packet to generate the error pattern E.

The codewords in the set $\{T_x\}$ is selected based on the following observations. The CRCs are linear codes, and therefore a difference of two valid codewords c is still a valid codeword, i.e., $c_{i,j} \equiv c_i - C_j \in C$. Therefore, a decoded packet with an undetectable error is basically the original codeword superimposed with an erroneous codeword, which is also a valid codeword.

Let $\rho$ be the bit error probability, then $P_{ue}$ is $$P_{ue} = \sum_{d > d_{min}} w_d \rho^d (1-\rho)^{N-d},$$

where $w_d$ is the number of CRC codewords with weight d, N is the CRC code length, and $d_{min}$ is the minimum distance of the codewords. If $\rho$ is small, then $P_{ue}$ is dominated by codewords with weights less than or equal to j, i.e., $$P_{ue} = \sum_{d > d_{min}}^{j} w_d \rho^d (1-\rho)^{N-d} + \delta,$$

where depending on the value of j, $\delta$ can be arbitrarily small.

The total number of codewords with weights smaller than or equal to j is very limited. The weight distributions of different CRCs are known to those of ordinary skill in the art. The most commonly used CRC lengths are 9 bits (CRC-8), 17 bits (CRC-16), 33 bits (CRC-32, and 65 bits (CRC-64).

Therefore, we can construct the set of known error patterns $\{T_x\}$ by selecting all CRC codewords with weights no greater than j. The weight upper bound of j is selected based on the probability $P_{ue}$ specified by the application.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

We claim:

1. A method for minimizing undetectable errors in a set of packets received in a receiver of a communication system of an application, wherein each packet includes a payload and a cyclical redundancy check, comprising the steps of:

receiving a set of packets;

verifying the CRC in each packet;

setting a CRC flag to 0 to indicate success and passing the payload of each packet and the CRC flag to the application if each CRC is verified;

setting the CRC flag to 1 to indicate failure of the verifying passing only the CRC flag to the application if all the packets fails the verifying, and if at least one packet in the set of packets fails the verifying further comprising the steps of:

generating an error pattern E for each packet that fails the CRC verification by comparing each packet that fails the CRC verification with one packet that passed the CRC verification;

comparing the error pattern to a set of known error patterns, where the subscript index is in the range [0, K], and $T_0$ is an all zero pattern, and the other K patterns include all valid codewords with weights less than a predetermined value;

setting a CRC flag to 0 to indicate success and passing the payload of each packet and the CRC flag to the application if the difference is less than a predetermined threshold, and otherwise, setting the CRC flag to 1 to indicate failure of the verifying passing only the CRC flag to the and application, wherein the steps are performed in the receiver.

2. The method of claim 1, wherein the generating is performed by an exclusive OR between the packet that failed the CRC verification, and the one packet that passed verification.

3. The method of claim 1, the set of known error patterns includes an all zero pattern, and all valid codewords that correspond to the payloads with weights less than or equal to a predetermined value.

4. The method of claim 1, wherein the difference is a distance between the error pattern of the failed packet and the set of known error patterns.

5. The method of claim 1, wherein the difference is a conditional probability between the error pattern of the failed packet and the set of known error patterns.

6. The method of claim 1, wherein the conditional probability is $$Pr(T_x \mid E) = \prod_n \exp\left(\frac{-(E(n) - T_x(n))^2}{2\sigma^2}\right),$$

where $T_x$ is the set of known error patterns, E is the error pattern of the packet that fails verifying, n is an index to the set of known error patterns, and $\sigma^2$ is the variance of E.

7. The method of claim 1, further comprising:
modifying bits in the payload that are known to change in each packet; and
regenerating the CRC for the modified payload to produce a modified packet.

* * * * *